(12) United States Patent
Xu et al.

(10) Patent No.: US 11,942,963 B2
(45) Date of Patent: Mar. 26, 2024

(54) FOLLOW-HOLD SWITCH CIRCUIT

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Daiguo Xu, Chongqing (CN); Dongbing Fu, Chongqing (CN); Zhengping Zhang, Chongqing (CN); Zhou Yu, Chongqing (CN); Jian'an Wang, Chongqing (CN); Can Zhu, Chongqing (CN); Ruzhang Li, Chongqing (CN); Guangbing Chen, Chongqing (CN); Yuxin Wang, Chongqing (CN); Xueliang Xu, Chongqing (CN)

(73) Assignees: NO. 24 RESEARCH INSTITUTE OF CHINA ELECTRONICS TECHNOLOGY GROUP CORPORATION, Chongqing (CN); Chongqing GigaChip Technology Co., Ltd., Chongqing (CN)

( * ) Notice: Subject to any disclaimer, the term of this patent is extended or adjusted under 35 U.S.C. 154(b) by 0 days.

(21) Appl. No.: 17/921,990

(22) PCT Filed: Jan. 19, 2021

(86) PCT No.: PCT/CN2021/072719
§ 371 (c)(1),
(2) Date: Oct. 28, 2022

(87) PCT Pub. No.: WO2022/032987
PCT Pub. Date: Feb. 17, 2022

(65) Prior Publication Data
US 2023/0198537 A1    Jun. 22, 2023

(30) Foreign Application Priority Data

Aug. 10, 2020    (CN) .......................... 202010795061.7

(51) Int. Cl.
H03M 1/12        (2006.01)
G11C 27/02       (2006.01)
H03K 17/687      (2006.01)

(52) U.S. Cl.
CPC ........... *H03M 1/1245* (2013.01); *G11C 27/02* (2013.01); *H03K 17/6871* (2013.01)

(58) Field of Classification Search
CPC .. H03M 1/1245; G11C 27/02; H03K 17/6871
See application file for complete search history.

(56) References Cited

U.S. PATENT DOCUMENTS

2004/0070439 A1    4/2004    Sarraj

FOREIGN PATENT DOCUMENTS

CN        101001085 A        7/2007
CN        101674085 B    *  12/2011
(Continued)

*Primary Examiner* — Metasebia T Retebo
(74) *Attorney, Agent, or Firm* — IPRTOP LLC

(57) ABSTRACT

A follow-hold switch circuit comprising: a follower; a sampling sub-circuit for voltage sampling; a bootstrap-control sub-circuit, which provides a bootstrap voltage to the sampling sub-circuit when the circuit is in a following state; a sampling-switch-control sub-circuit, which provides a common-mode voltage to a bootstrap capacitor in the bootstrap-control sub-circuit when the circuit is in a holding state; the follower is connected to an output of the sampling sub-circuit; the sampling sub-circuit is connected to the bootstrap-control sub-circuit and the sampling-switch-control sub-circuit respectively through a sampling switch; the present disclosure can effectively improve the linearity of sampling switches.

11 Claims, 4 Drawing Sheets

(56) References Cited

FOREIGN PATENT DOCUMENTS

| | | | | |
|---|---|---|---|---|
| CN | 103716054 A | | 4/2014 | |
| CN | 107370487 A | * | 11/2017 | .......... H03M 1/1245 |
| CN | 107370487 A | | 11/2017 | |
| CN | 111900986 A | | 11/2020 | |

* cited by examiner

FOLLOW-HOLD SWITCH CIRCUIT

FIELD OF TECHNOLOGY

The present disclosure generally relates to the field of integrated circuit design, and in particular to a follow-hold switch circuit.

BACKGROUND

In recent years, with the further improvement of the performance index of analog-to-digital converters, especially with the continuous development of the integrated circuit process technology, research on high-precision analog-to-digital converters has become more and more in-depth, and the high-precision analog-to-digital converters has put forward higher requirements for sampling switches. In a traditional gate-voltage-bootstrap sampling switch, an NMOS transistor is usually used as the sampling switch. Through the gate voltage bootstrap technology, the voltage difference between the gate and the source of the sampling NMOS transistor can theoretically be kept as VDD, and this technology enables the sampling switch to maintain a high linearity. However, the traditional structure has certain problems; for example, when the sampling NMOS transistor is in an on state, its gate voltage is equal to the sum of an input signal VIN and VDD, and when the input signal has a small amplitude, the absolute value of the gate voltage of the sampling NMOS transistor is also relatively small, which means there will be no serious problems; but when the input signal has a large amplitude, the absolute value of the gate voltage of the sampling NMOS transistor will increases accordingly, a gate voltage that is too high will hinder the device's reliability; at the same time, a high gate voltage may also cause undesired leakage current, thus causing the gate voltage of the sampling NMOS transistor to be clamped to a fixed value, which can seriously affect the linearity of the sampling NMOS transistor. It is difficult for the traditional structure to meet the requirements imposed by a sampling switch with a high linearity, in applications that demand high-speed and large input signal.

SUMMARY

The present disclosure proposes a follow-hold switch circuit.

The technical solution used in the present disclosure is as follows.

A follow-hold switch circuit, comprising.
a follower;
a sampling sub-circuit for performing voltage sampling.
a bootstrap-control sub-circuit, which providing a bootstrap voltage to the sampling sub-circuit when the follow-hold switch circuit is in a following state; and
a sampling-switch-control sub-circuit, which provides a common-mode voltage to a bootstrap capacitor in the bootstrap-control sub-circuit when the follow-hold switch circuit is in a holding state;
wherein the follower is connected to an output of the sampling sub-circuit, the sampling sub-circuit is connected to the bootstrap-control sub-circuit and the sampling-switch-control sub-circuit via a sample switch respectively.

Optionally, by means of a clock signal and an inverted clock signal, the circuit as a whole is controlled to be in a following state or a holding state.

Optionally, the circuit is in a holding state when the clock signal is low and the inverted clock signal is high, and the circuit is in a following state when the clock signal is high and the inverted clock signal is low.

Optionally, the follower comprises at least a first MOS transistor and a constant current source, a drain of the first MOS transistor is connected to a supply voltage, a gate of the first MOS transistor is connected to the sampling sub-circuit, and a source of the first MOS transistor is connected to a positive terminal of the constant current source; wherein a negative terminal of the constant current source is grounded.

Optionally, the sampling sub-circuit comprises a sampling capacitor, a second MOS transistor, a fourth MOS transistor, and a fifth MOS transistor; one terminal of the sampling capacitor is connected to an input of the follower and to a drain of the fifth MOS transistor, respectively, and the other terminal of the sampling capacitor is connected to a drain of the second MOS transistor and to a drain of the fourth MOS transistor, respectively; the second MOS transistor acts as the sampling switch, and is connected to the bootstrap-control sub-circuit and the sampling-switch-control sub-circuit, respectively; a gate of the fourth MOS transistor is connected to the inverted clock signal and the gate of the fifth MOS transistor is connected to the clock signal; a source of the fourth MOS transistor and a source of the fifth MOS transistor are connected and then connected to the common-mode voltage.

Optionally, the sampling-switch-control sub-circuit comprises a third MOS transistor, a sixth MOS transistor, and a thirteenth MOS transistor, wherein a drain of the thirteenth MOS transistor is connected to a gate of the sampling switch; wherein a gate of the thirteenth MOS transistor is connected to a gate of the sixth MOS transistor and a gate of the third MOS transistor, respectively, and is also connected to the inverted clock signal; wherein a source of the thirteenth MOS transistor, a source of the third MOS transistor, a source of the sixth MOS transistor are connected together and then connected to the common-mode voltage; wherein a drain of the sixth MOS transistor is connected to a first terminal of the bootstrap-control sub-circuit; a drain of the third MOS transistor is connected to a second terminal of the bootstrap-control sub-circuit.

Optionally, the bootstrap-control sub-circuit comprises: a switch module and a bootstrap module, wherein the switch module is connected to two terminals of the bootstrap module, wherein the switch module, through a supply voltage and an input voltage, controls the bootstrap module to generate the bootstrap voltage when the circuit is in a following state, and outputs the bootstrap voltage to the sampling switch.

Optionally, the switch module comprises a seventh MOS transistor, an eighth MOS transistor, a ninth MOS transistor, a tenth MOS transistor, an eleventh MOS transistor, and a twelfth MOS transistor; wherein a source of the seventh MOS transistor is connected to the input voltage, a drain of the seventh MOS transistor is connected to a drain of the third MOS transistor and a source of the sampling switch, a source of the eighth MOS transistor, and one terminal of the bootstrap module; wherein a gate of the seventh MOS transistor is connected to a drain of the eleventh MOS transistor; wherein the other terminal of the bootstrap module is connected to a source of the tenth MOS transistor, a source of the eleventh MOS transistor, and a source of the twelfth MOS transistor, respectively; wherein a drain of the twelfth MOS transistor is connected to a gate of the sampling switch and a drain of the thirteenth MOS transistor, respectively; wherein a drain of the ninth MOS transistor is connected to a gate of the eleventh MOS transistor, a gate of the twelfth MOS transistor, and a drain of the eighth MOS transistor, respectively; wherein a gate of the ninth MOS transistor is connected to a gate of the eighth MOS transistor and to the clock signal; wherein a source of the ninth MOS transistor is connected to a drain of the tenth MOS transistor and to the supply voltage; wherein a gate of the tenth MOS transistor is connected to the clock signal.

Optionally, the bootstrap module includes a bootstrap capacitor, one terminal of the bootstrap capacitor is connected to the source of the sampling switch and the other terminal of the bootstrap capacitor is connected to the source of the twelfth MOS transistor.

Optionally, the MOS transistors in the follower, in the sampling sub-circuit and in the the sampling-switch-control sub-circuit are all NMOS transistors.

Optionally, the seventh to ninth MOS transistors are NMOS transistors; the tenth to twelfth MOS transistors are PMOS transistors.

As described above, the follow-hold switch circuit of the present disclosure has the following beneficial effects:

When the circuit is in the holding state, the voltage at one terminal of the bootstrap-control sub-circuit is controlled by the sampling-switch-control sub-circuit to be a common-mode voltage, and is not pulled down to the ground level, which effectively improves the linearity of the sampling switch.

DETAILED DESCRIPTION

The following describes the implementation of the present invention through specific examples, and those skilled in the art can easily understand other advantages and effects of the present invention from the content disclosed in this specification. The present disclosure can also be implemented or applied through other different specific embodiments. Various details in this specification can also be modified or changed based on different viewpoints and applications without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout may also be more complicated.

Figure 1:
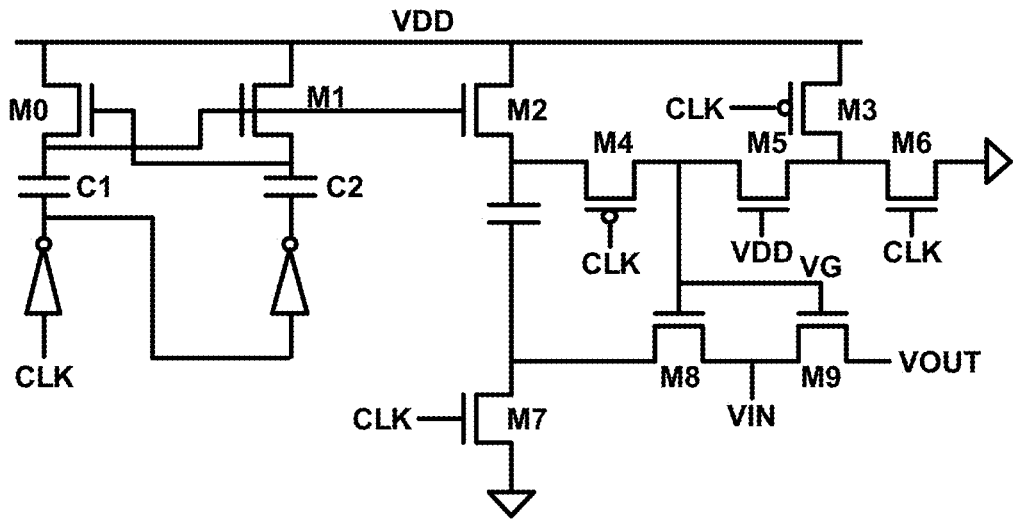
FIG. 1 shows a schematic diagram of a traditional gate-voltage-bootstrap sampling switch.

Referring to FIG. 1, which is a schematic diagram of a traditional gate-voltage-bootstrap sampling switch based on NMOS transistors. When the input signal VIN changes, a gate-voltage-bootstrap circuit generates a bootstrap voltage to keep its input and output voltages at a constant value, thus enabling a sampling NMOS transistor M9 to obtain a constant gate-source voltage difference, thereby improving the linearity of a sampling NMOS transistor M1. When the sampling switch is in a charge storage state, a sampling clock signal CLK is 1, a PMOS transistor M4 is off, and the sampling switch M9 is off. A NMOS transistor M7 conducts one terminal of a bootstrap capacitor Cp to ground, and a charge pump consisting of C1, C2, M1 and M2 makes a NMOS transistor M2 conduct. At this time, the voltage difference between the two terminals of the bootstrap capacitor Cp is VDD. When the sampling switch is in a sampling state, the sampling clock signal CLK becomes 0, the PMOS transistor M4 is on, the NMOS transistor M8 is on, the NMOS transistor M7 is off, one terminal of the bootstrap capacitor Cp is connected to the input signal VIN, and the charge pump consisting of C1, C2, M1 and M2 turns the NMOS transistor M2 off. At this time, the voltage difference between the two terminals of the bootstrap capacitor Cp is VIN+VDD, thus keeping the gate-source voltage difference of the sampling switch M9 as VDD.

If the charge sharing effect of the parasitic capacitor is ignored, theoretically the gate voltage of M1 is VIN+vdd; then, when M1 is on, its gate-source voltage difference is kept as vdd, and its conducting resistance can be expressed as $$R_{boot,n} = \frac{1}{\mu_n C_{ox}\left(\frac{W}{L}\right)_n (vdd - V_{thn})}$$

$\mu_n$ is the carrier mobility, $C_{ox}$ is the MOS transistor's gate capacitance; (W/L) is the MOS transistor's aspect ratio; $V_{thn}$ is the MOS transistor's threshold voltage.

As can be seen from the above equation, due to the presence of the NMOS transistor M1's gate-voltage-bootstrap circuit, the conducting resistance of the NMOS sampling switch does not vary with the input signal VIN and is a fixed value; therefore, the sampling switch M1 can provide a good linearity. However, the above traditional bootstrap sampling switch has a problem that a charge pump circuit is introduced to generate a higher voltage to control the on and off of the M2 transistor. The charge pump circuit requires two capacitors C1 and C2 to generate a high voltage, which makes the sampling switch larger and more costly due to the presence of the capacitors.

Figure 2:
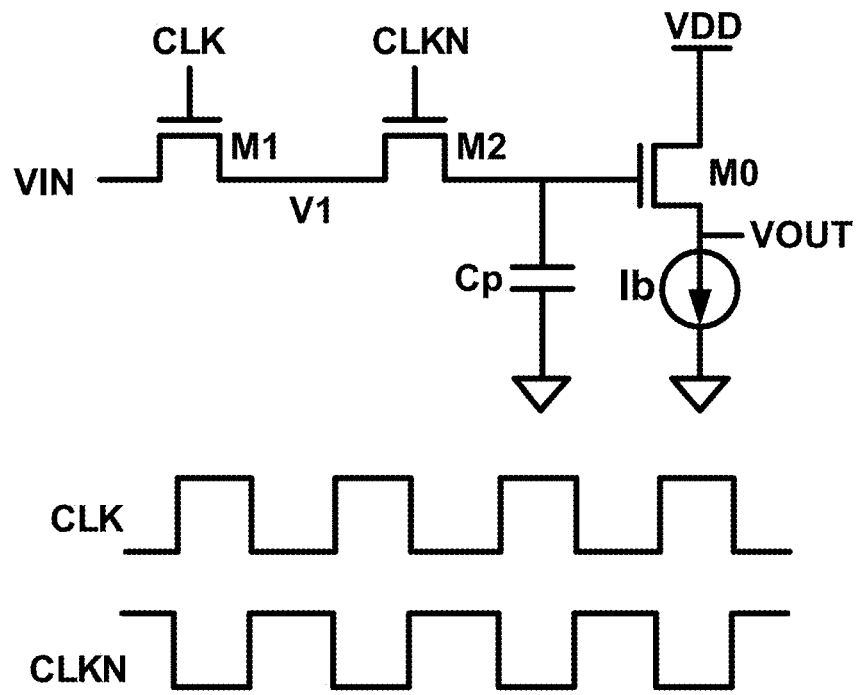
FIG. 2 shows a schematic diagram and a timing diagram of a follow-hold switch with a traditional structure.

A schematic diagram and a timing diagram of a follow-hold switch with a traditional structure is shown in FIG. 2. When the sampling control signal CLK is 0 and its inverted signal CLKN is 1, the follow-and-hold switch is in a holding state. At this time, the switch M1 is off and the switch M2 is on, and the voltage on sampling capacitor Cp is the voltage obtained by sampling. When the sampling control signal CLK is 1 and its inverted signal CLKN is 0, the follow-hold switch is in a following state. At this time, the switch M1 is on and the switch M2 is off, and the source voltage V1 of the switch M1 follows the change of the input signal VIN. However, one disadvantage of this structure is that both switches M1 and M2 are controlled by standard clocks, and the gate-source voltage differences of the switches vary with the input signal VIN, which results in poor linearity.

Figure 3:
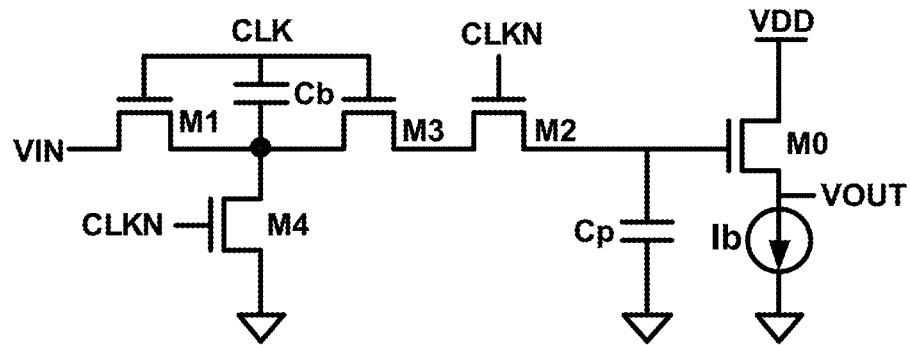
FIG. 3 shows a schematic diagram and a timing diagram of a follow-and-hold switch [1] with a traditional bootstrap structure.
Figure 3:
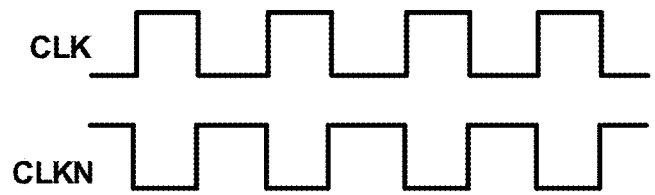

Based on the aforementioned bootstrap structure and the traditional follow-and-hold switch structure, another traditional follow-and-hold switch structure[1] was proposed, whose circuit and timing diagrams are shown in FIG. 3. When the sampling control signal CLK is 0 and its inverted signal CLKN is 1, the follow-and-hold switch is in a holding state. At this time, switches M1 and M3 are off, switches M2 and M4 are on, and the voltage on the sampling capacitor Cp is the voltage obtained by sampling. When the sampling control signal CLK is 1 and its inverted signal CLKN is 0, the follow-and-hold switch is in a following state. At this time, switches M1 and M3 are on, switches M2 and M4 are off, and the output voltage of switch M3 follows the input signal VIN. Problems of the above traditional structure follow-and-hold switch include: 1) When the follow-and-hold switch is in a holding state, the switch bootstrap capacitor Cb is pulled down to 0. For a fully differential structure, this means lower plates of bootstrap capacitors Cb in both differential sampling switches are pulled down to 0, instead of an input common-mode voltage, which causes the linearity of the sampling switches to degrade. 2) In the traditional structure, one terminal of the sampling capacitor Cp is connected to the sampling switch M2 and the other terminal of the sampling capacitor Cp is grounded, which causes the charge to be injected into the upper plate of the sampling capacitor Cp when the sampling switch is turned off, thus affecting the sampling accuracy. 3) In order to improve the linearity of the sampling switch, a charge pump is usually used to boost the gate voltage of the sampling switch, which will required multiple capacitors as previously described, increasing the area of the board.

Figure 4:
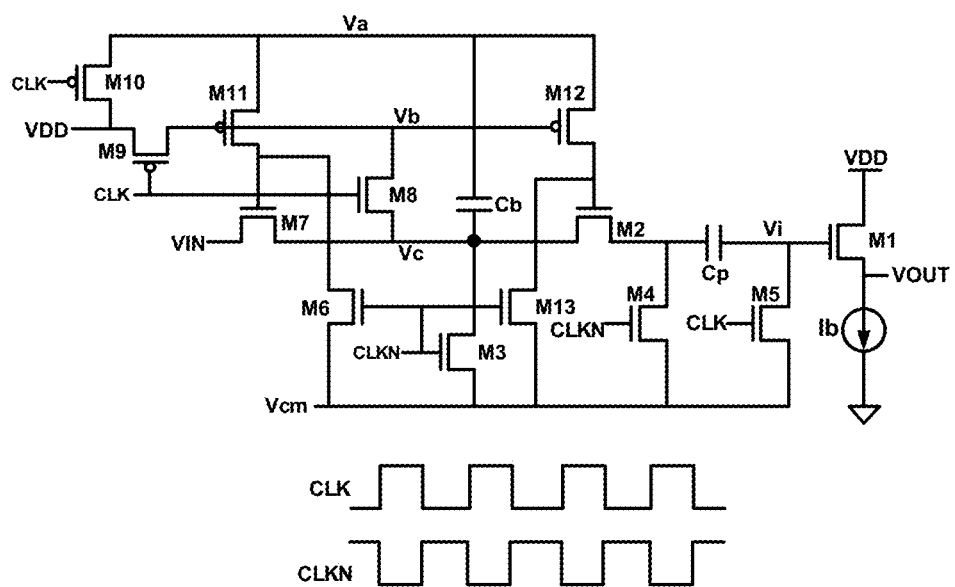
FIG. 4 shows a schematic diagram of a follow-hold switch circuit in one embodiment of the present disclosure.

Referring to FIG. 4, the present disclosure provides a follow-hold switch circuit, including a follower, a sampling sub-circuit, a bootstrap-control sub-circuit, and a sampling-switch-control sub-circuit.

In one embodiment, by means of a clock signal and an inverted clock signal, the circuit as a whole is controlled to be in a following state or a holding state.

In one embodiment, the follower includes a first MOS transistor M1 and a constant current source Ib.

The sampling sub-circuit includes a second MOS transistor M2, a fourth MOS transistor M4, a fifth MOS transistor M5, and a sampling capacitor Cp; wherein M2 acts as a sampling switch.

The sampling-switch-control sub-circuit includes: a sixth MOS transistor M6, a third MOS transistor M3, and a thirteenth MOS transistor M13.

In one embodiment, the bootstrap-control sub-circuit includes a switch module and a bootstrap module.

In one embodiment, the switch module includes the seventh to twelfth MOS transistors, numbered M7 to M12 in that order.

In one embodiment, the bootstrap module may include a bootstrap capacitor Cb.

The sub-circuits are connected as follows:

The first MOS transistor M1 has a drain connected to a supply voltage VDD, a gate connected to one terminal of the sampling capacitor Cp and a drain of the fifth MOS transistor M5, respectively, and a source connected to a positive terminal of the constant current source Ib; a negative terminal of the constant current source Ib is grounded.

A source of the fourth MOS transistor M4 and a source of the fifth MOS transistor M5 are connected to a common-mode voltage Vcm; a gate of the fourth MOS transistor M4 is connected to an inverted clock signal CLKN, and a gate of the fifth MOS transistor M5 is connected to a clock signal CLK.

The other terminal of the sampling capacitor Cp is connected to a drain of the second MOS transistor M2 and a drain of the fourth MOS transistor M4, respectively; a gate of the second MOS transistor M2 is connected to a drain of the twelfth MOS transistor M12 and a drain of the thirteenth MOS transistor M13, respectively.

A gate of the thirteenth MOS transistor M13 is connected to a gate of the sixth MOS transistor M6 and a gate of the third MOS transistor M3, respectively, and to the inverted clock signal CLKN; a source of the thirteenth MOS transistor M13, a source of the third MOS transistor M3, and a source of the sixth MOS transistor M6 are connected together and then connected to the common mode voltage Vcm; a drain of the sixth MOS transistor M6 is connected to a gate of the seventh MOS transistor M7 and a drain of the eleventh MOS transistor M11; a drain of the third MOS transistor M3 is connected to one terminal of the bootstrap capacitor Cb, a source of the second MOS transistor M2, a drain of the seventh MOS transistor M7, and a source of the eighth MOS transistor M8; the other terminal of the bootstrap capacitor Cb is connected to a source of the tenth MOS transistor M10, a source of the eleventh MOS transistor M11, and a source of the twelfth MOS transistor M12.

A source of the seventh MOS transistor M7 is connected to the input voltage VIN; the other terminal of the bootstrap capacitor Cb is connected to a source of the tenth MOS transistor M10, a source of the eleventh MOS transistor M11, and a source of the twelfth MOS transistor M12 respectively; a drain of the ninth MOS transistor M9 is connected to a gate of the eleventh MOS transistor M11, a gate of the twelfth MOS transistor M12, and a drain of the eighth MOS transistor M8; a gate of the ninth MOS transistor M9 is connected to a gate of the eighth MOS transistor M8 and connected to the clock signal CLK; a source of the ninth MOS transistor M9 is connected to a drain of the tenth MOS transistor M10 and connected to the supply voltage VDD; a gate of the tenth MOS transistor M10 is connected to the clock signal CLK.

In one embodiment, MOS transistors M1 to M8 are NMOS transistors, and MOS transistors M9 to M12 are PMOS transistors.

Figure 5:
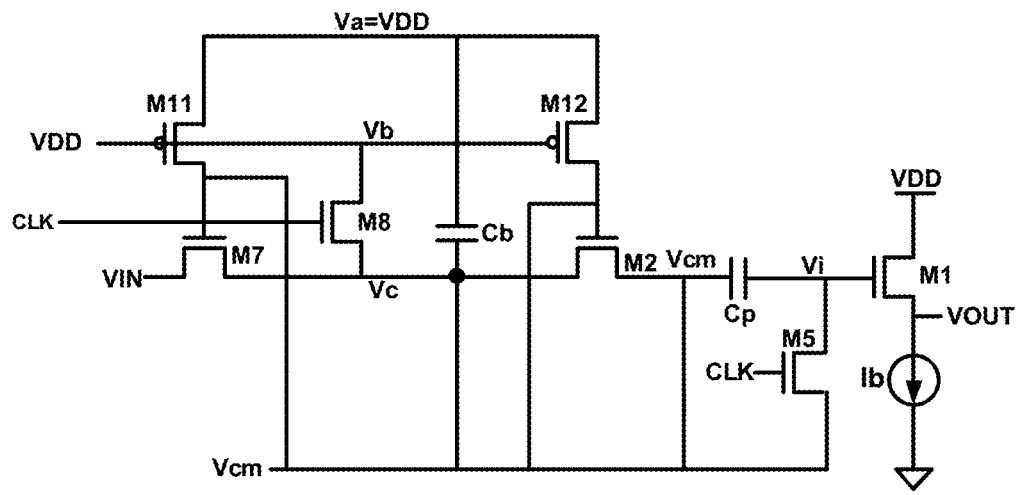
FIG. 5 shows a schematic diagram of an equivalent circuit of a follow-hold switch circuit in a holding state in one embodiment of the present disclosure.

When the sampling clock signal CLK is 0 and the inverted clock signal CLKN is 1, the follow-hold structure is in a holding state, and its equivalent circuit is shown in FIG. 5; the switches shown in FIG. 5 (except M1) are all off, and the switches that are on has been represented by straight lines. At this time, the voltages on two terminals of the bootstrap capacitor Cb are Vcm and VDD, respectively, the bootstrap capacitor Cb is in a charge storage state, and the gate voltage of M5 is the input voltage from the last clock cycle. In the traditional structure, Vc would be grounded at this time, resulting in the drain of M7 transistor and the source of M2 transistor having zero voltage when the follow-hold structure is in a holding state. Since the traditional follow-hold structure is usually a fully differential structure, the Vc in both differential follow-hold structures is 0 instead of the common-mode voltage, which affects the linearity of the entire follow-hold structure. With the structure of the present disclosure, when the follow-hold structure is in a holding state, Vc in both differential follow-hold structures is the common-mode voltage Vcm, which can significantly improve the linearity of the follow-hold structure. At this time, the voltage difference across the two terminals of the sampling capacitor is Vcm−Vi.

Figure 6:
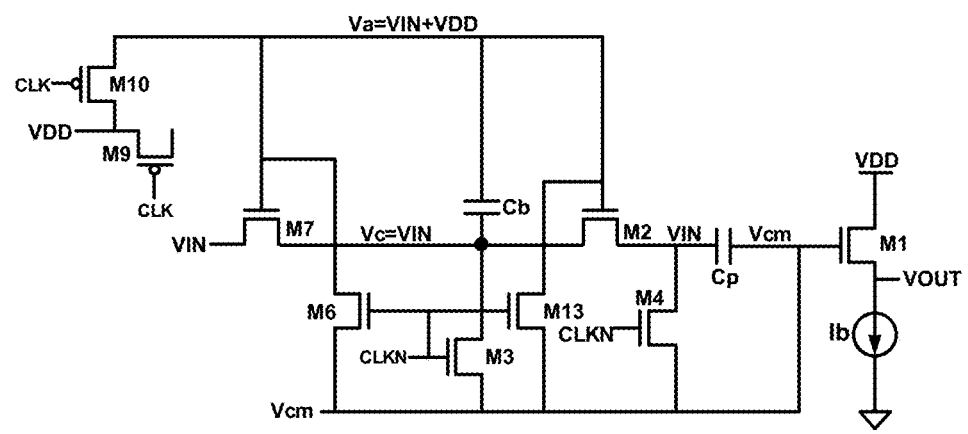
FIG. 6 shows a schematic diagram of an equivalent circuit of a follow-hold switch circuit in a following state in one embodiment of the present disclosure.

When the sampling clock signal CLK is 1 and CLKN is 0, the follow-hold structure is in a following state, and its equivalent circuit is shown in FIG. 6; the switches shown in FIG. 6 (except M1, M2 and M7) are off; since M2 and M7 are on, the drain voltage Vc of M7 is equal to VIN; since switch M3 is off, the bootstrap capacitor Cb is in a bootstrap state, and Va is bootstrapped to VIN+VDD, and therefore the gate voltages of switches M2 and M7 are bootstrapped to VIN+VDD, improving the linearity of the sampling switches M2 and M7. At this time, the voltage difference across the two terminals of the sampling capacitor is VIN−Vcm. The advantage of this structure is that, the traditional bootstrap sampling switch needs at least three capacitors to achieve voltage bootstrapping, but this structure only needs one capacitor to achieve voltage bootstrapping, which obviously reduces the area of the circuit and lowers the cost of the circuit.

In summary, from the law of conservation of charge, it follows that Vi=2Vcm−VIN when the follow-hold structure is in a holding state; and since the circuit is a fully differential circuit, the sampling voltage of the differential follow-hold switch can be expressed as VIP−VIN, thus, achieving following and sampling.

In one embodiment, in order to further verify the above advantages of the present disclosure, the aforementioned two structures (the traditional structure [1] and the structure of the present disclosure) are designed under 40 nm CMOS process, and the same input/output transistors and load transistor dimensions are used for both structures. In the present disclosure, the bootstrap capacitor Cb is has a capacitance of 0.1 pF, the sampling capacitor Cp has a capacitance of 0.2 pF, the supply voltage VDD is 1.2V, and the input bias voltage is 0.6V.

Figure 7:
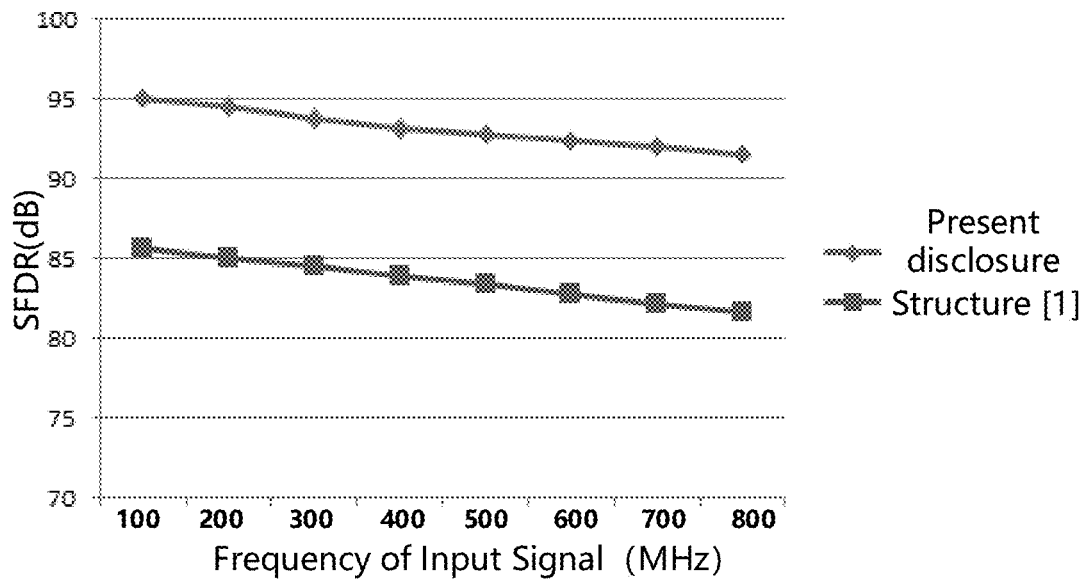
FIG. 7 shows comparison of simulation results of the spurious-free dynamic ranges (SFDR) of two sampling switch structures with the SFDR varying with the frequency of an input signal.
Figure 8:
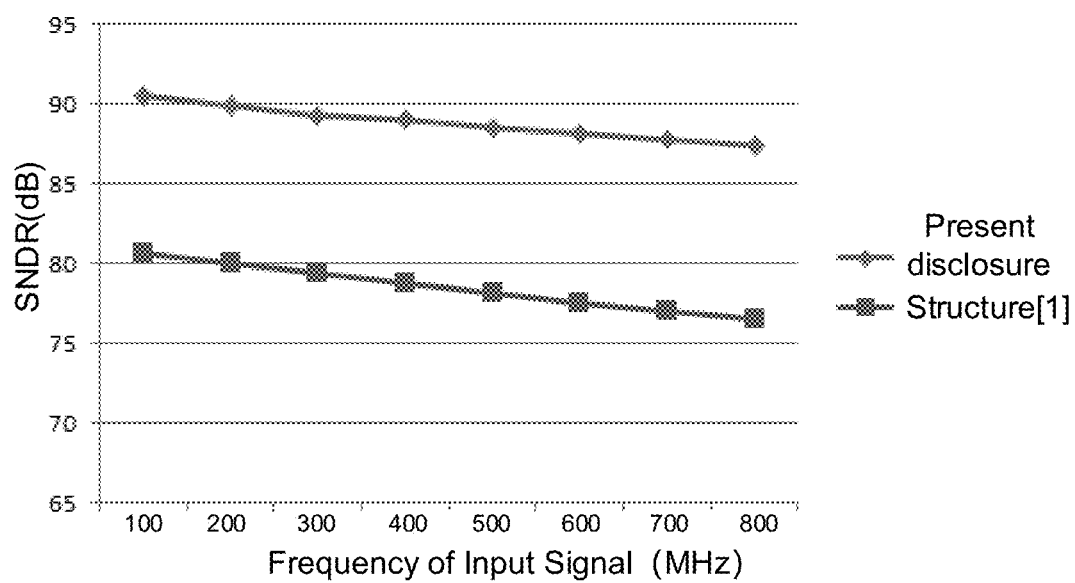
FIG. 8 shows comparison of simulation results of the signal noise distortion ratio (SNDR) of two sampling switch structures with the SNDR varying with the frequency of an input signal.

Comparison of simulation results of the spurious-free dynamic ranges (SFDR) of two sampling switch structures with the SFDR varying with the frequency of an input signal is shown in FIG. 7, where the horizontal coordinate is the frequency of the input signal and the vertical coordinate is the SFDR. From FIG. 7, it can be seen that the present disclosure improves the SFDR by about 10 dB when the input frequency is low and by about 8 dB when the input frequency is high, compared with the traditional structure [1]. Comparison of simulation results of the signal noise distortion ratio (SNDR) of two sampling switch structures with the SNDR varying with the frequency of an input signal is shown in FIG. 8, where the horizontal coordinate is the frequency of the input signal and the vertical coordinate is SNDR. From FIG. 8, it can be seen that the present disclosure improves the SNDR by about 9.8 dB when the amplitude of the input signal is low and by about 11 dB when the amplitude of the input signal is high compared with the traditional structure [1].

In summary, a follow-hold switch circuit is provided by the present disclosure, in which a bootstrap capacitor Cb is introduced to achieve gate voltage bootstrapping of a sampling switch transistor, which obviously simplifies the circuit structure, reduces the circuit area and lowers the cost of the circuit compared with the traditional structure; having introduced a sampling switch control structure consisting of M3, M6 and M13, when the follow-hold switch in a holding state, reset voltages at the Vc points in both differential switches are equal to a common mode voltage Vcm, which significantly improves the linearity of the sampling switch, compared to the traditional structure where the reset voltage at Vc is 0. A sampling network consisting of switches M4, M5, and a sampling capacitor Cp ensures that, when the sampling process ends, M5 is off first, M2 is then off, and finally M4 is on, so that any charge injection caused by the disconnection of M2 does not affect the accuracy of the entire sampling switch. Therefore, the present disclosure effectively overcomes various shortcomings of the prior art and has a high value for industrial application.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A follow-hold switch circuit, comprising:
   a follower;
   a sampling sub-circuit, for voltage sampling;
   a bootstrap-control sub-circuit, which provides a bootstrap voltage to the sampling sub-circuit when the follow-hold switch circuit is in a following state; and
   a sampling-switch-control sub-circuit, which provides a common-mode voltage to a bootstrap capacitor in the bootstrap-control sub-circuit when the follow-hold switch circuit is in a holding state;
   wherein the follower is connected to an output of the sampling sub-circuit, the sampling sub-circuit is connected to the bootstrap-control sub-circuit and the sampling-switch-control sub-circuit via a sample switch, respectively;
   wherein the follower comprises at least a first MOS transistor and a constant current source, a drain of the first MOS transistor is connected to a supply voltage, a gate of the first MOS transistor is connected to the sampling sub-circuit, and a source of the first MOS transistor is connected to a positive terminal of the constant current source; wherein a negative terminal of the constant current source is grounded.

2. The follow-hold switch circuit according to claim 1, wherein: by means of a clock signal and an inverted clock signal, the follow-hold switch circuit as a whole is controlled to be in a following state or a holding state.

3. The follow-hold switch circuit according to claim 2, wherein the follow-hold switch circuit is in a holding state when the clock signal is low and the inverted clock signal is high, and the follow-hold switch circuit is in a following state when the clock signal is high and the inverted clock signal is low.

4. The follow-hold switch circuit according to claim 2, wherein the sampling sub-circuit comprises a sampling capacitor, a second MOS transistor, a fourth MOS transistor, and a fifth MOS transistor; one terminal of the sampling capacitor is connected to an input of the follower and to a drain of the fifth MOS transistor, respectively, and the other terminal of the sampling capacitor is connected to a drain of the second MOS transistor and to a drain of the fourth MOS transistor, respectively; the second MOS transistor acts as the sampling switch, and is connected to the bootstrap-control sub-circuit and the sampling-switch-control sub-circuit, respectively; a gate of the fourth MOS transistor is connected to the inverted clock signal and the gate of the fifth MOS transistor is connected to the clock signal; a source of the fourth MOS transistor and a source of the fifth MOS transistor are connected and then connected to the common-mode voltage.

5. The follow-hold switch circuit according to claim 2, wherein the sampling-switch-control sub-circuit comprises a third MOS transistor, a sixth MOS transistor, a thirteenth MOS transistor, wherein a drain of the thirteenth MOS transistor is connected to a gate of the sampling switch; wherein a gate of the thirteenth MOS transistor is connected to a gate of the sixth MOS transistor and a gate of the third MOS transistor, respectively, and is also connected to the inverted clock signal; wherein a source of the thirteenth MOS transistor, a source of the third MOS transistor, and a source of the sixth MOS transistor are connected together and then connected to the common-mode voltage; wherein a drain of the sixth MOS transistor is connected to a first terminal of the bootstrap-control sub-circuit; a drain of the third MOS transistor is connected to a second terminal of the bootstrap-control sub-circuit.

6. The follow-hold switch circuit according to claim 2, wherein the bootstrap-control sub-circuit comprises: a switch module and a bootstrap module, wherein the switch module is connected to two terminals of the bootstrap module, wherein the switch module, through a supply voltage and an input voltage, controls the bootstrap module to generate the bootstrap voltage when the circuit is in a following state, and outputs the bootstrap voltage to the sampling switch.

7. The follow-hold switch circuit according to claim 5, wherein the switch module comprises a seventh MOS transistor, an eighth MOS transistor, a ninth MOS transistor, a tenth MOS transistor, an eleventh MOS transistor, and a twelfth MOS transistor; wherein a source of the seventh MOS transistor is connected to the input voltage, a drain of the seventh MOS transistor is connected to a drain of the third MOS transistor and a source of the sampling switch, a source of the eighth MOS transistor, and one terminal of the bootstrap module; wherein a gate of the seventh MOS transistor is connected to a drain of the eleventh MOS transistor; wherein the other terminal of the bootstrap module is connected to a source of the tenth MOS transistor, a source of the eleventh MOS transistor, and a source of the twelfth MOS transistor, respectively; wherein a drain of the twelfth MOS transistor is connected to a gate of the sampling switch and a drain of the thirteenth MOS transistor, respectively; wherein a drain of the ninth MOS transistor is connected to a gate of the eleventh MOS transistor, a gate of the twelfth MOS transistor, and a drain of the eighth MOS transistor, respectively; wherein a gate of the ninth MOS transistor is connected to a gate of the eighth MOS transistor and to the clock signal; wherein a source of the ninth MOS transistor is connected to a drain of the tenth MOS transistor and to the supply voltage; wherein a gate of the tenth MOS transistor is connected to the clock signal.

8. The follow-hold switch circuit according to claim 7, wherein the bootstrap module includes a bootstrap capacitor, one terminal of the bootstrap capacitor is connected to the source of the sampling switch and the other terminal of the sampling switch is connected to the source of the twelfth MOS transistor.

9. The follow-hold switch circuit according to claim 1, wherein MOS transistors in the follower, in the sampling sub-circuit and in the sampling-switch-control sub-circuit are all NMOS transistors.

10. The follow-hold switch circuit according to claim 7, wherein the seventh to ninth MOS transistors are all NMOS transistors and the tenth to twelfth MOS transistors are all PMOS transistors.

11. The follow-hold switch circuit according to claim 6, wherein the switch module comprises a seventh MOS transistor, an eighth MOS transistor, a ninth MOS transistor, a tenth MOS transistor, an eleventh MOS transistor, and a twelfth MOS transistor; wherein a source of the seventh MOS transistor is connected to the input voltage, a drain of the seventh MOS transistor is connected to a drain of the third MOS transistor and a source of the sampling switch, a source of the eighth MOS transistor, and one terminal of the bootstrap module; wherein a gate of the seventh MOS transistor is connected to a drain of the eleventh MOS transistor; wherein the other terminal of the bootstrap module is connected to a source of the tenth MOS transistor, a source of the eleventh MOS transistor, and a source of the twelfth MOS transistor, respectively; wherein a drain of the twelfth MOS transistor is connected to a gate of the sampling switch and a drain of the thirteenth MOS transistor, respectively; wherein a drain of the ninth MOS transistor is connected to a gate of the eleventh MOS transistor, a gate of the twelfth MOS transistor, and a drain of the eighth MOS transistor, respectively; wherein a gate of the ninth MOS transistor is connected to a gate of the eighth MOS transistor and to the clock signal; wherein a source of the ninth MOS transistor is connected to a drain of the tenth MOS transistor and to the supply voltage; wherein a gate of the tenth MOS transistor is connected to the clock signal.

* * * * *